United States Patent [19]

Yama et al.

[11] Patent Number: 5,075,240

[45] Date of Patent: Dec. 24, 1991

[54] SEMICONDUCTOR DEVICE MANUFACTURED BY USING CONDUCTIVE ION IMPLANTATION MASK

[75] Inventors: Yomiyuki Yama; Masatoshi Yasunaga; Katsuyoshi Mitsui; Ikuo Ogoh, all of Hyogo, Japan

[73] Assignee: Mitsubishi Denki Kabushiki Kaisha, Tokyo, Japan

[21] Appl. No.: 509,850

[22] Filed: Apr. 17, 1990

[30] Foreign Application Priority Data

Apr. 19, 1989 [JP] Japan .................................. 1-100909

[51] Int. Cl.$^5$ .......................................... H01L 21/265
[52] U.S. Cl. ...................................... 437/20; 437/52; 437/34; 437/229; 437/931
[58] Field of Search .................... 437/931, 243, 1, 229, 437/34, 20; 148/DIG. 137, DIG. 106; 357/8

[56] References Cited

U.S. PATENT DOCUMENTS

| 4,361,641 | 11/1982 | Angus et al. | 204/29 |
| 4,819,057 | 4/1989 | Naito et al. | 357/17 |
| 4,933,257 | 6/1990 | Miura et al. | 430/191 |
| 4,939,556 | 7/1990 | Eguch et al. | 357/8 |

FOREIGN PATENT DOCUMENTS

| 0104111 | 3/1984 | European Pat. Off. | 437/34 |
| 0023243 | 2/1982 | Japan | 437/34 |
| 58-96732 | 6/1983 | Japan | |
| 60-116128 | 6/1985 | Japan | |
| 0188359 | 8/1987 | Japan | 437/34 |
| 0058824 | 3/1988 | Japan | 437/229 |
| 0128660 | 6/1988 | Japan | 437/34 |

OTHER PUBLICATIONS

Yoshida, Patent Abstracts of Japan, vol. 7, No. 194, #56-195214, filed: 3-12-81, published: 24-8-83.
Akiba et al., #60-116128, Patent Abstracts of Japan, vol. 9, No. 270, filed: 29-11-83, published: 26-10-85.
"Ion Implantation", VLSI Technology, chapter six, pp. 219-265, by T. E. Seidel, 1983.

Primary Examiner—Olik Chaudhuri
Assistant Examiner—Ken Horton
Attorney, Agent, or Firm—Lowe, Price, LeBlanc and Becker

[57] ABSTRACT

A conductive resist film is used as a mask in ion implantation. A portion of the conductive resist film is electrically connected to a semiconductor substrate. The charge of ions which enter the conductive resist film in ion implantation flows into the semiconductor substrate and dissipates therein.

10 Claims, 12 Drawing Sheets

MEMORY CELL PORTION

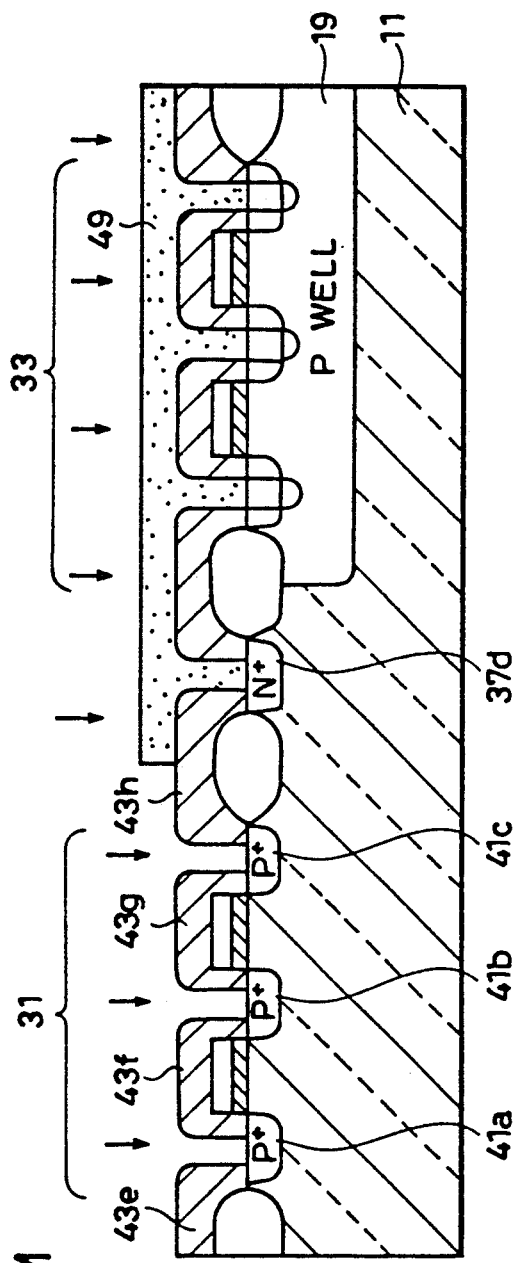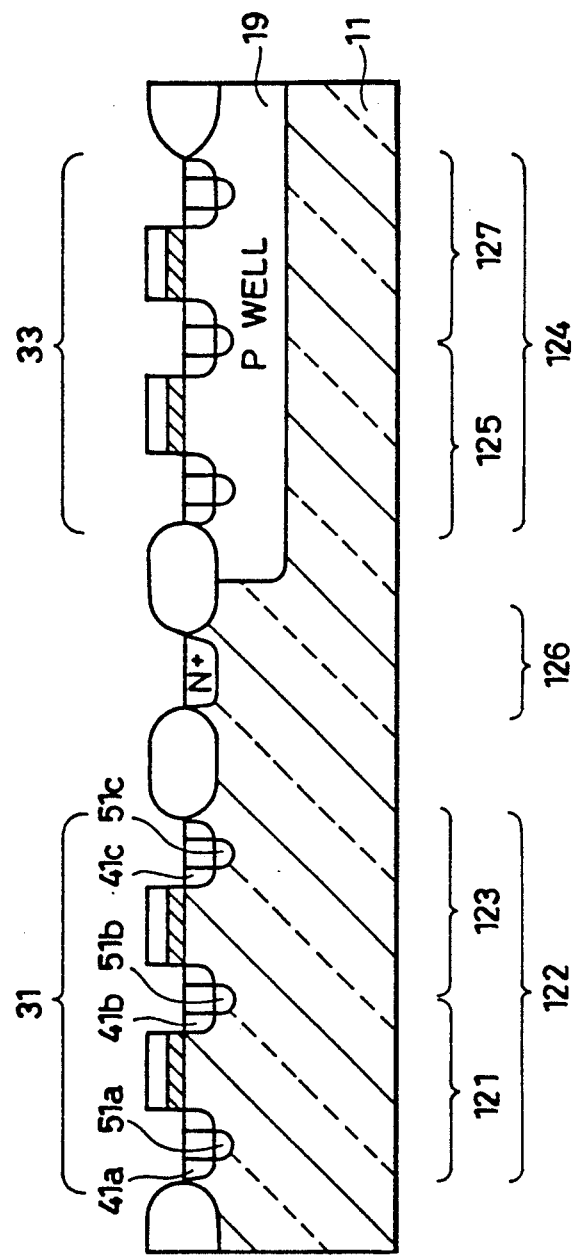

SEMICONDUCTOR DEVICE MANUFACTURED BY USING CONDUCTIVE ION IMPLANTATION MASK

BACKGROUND OF THE INVENTION

1. Field of the Invention

The present invention relates generally to semiconductor devices, and more particularly to semiconductor devices manufactured by using conductive resist films as masks in ion implantation. The invention further relates to a method of manufacturing such semiconductor devices.

2. Description of the Background Art

In the manufacture of a semiconductor integrated circuit, when a transistor or the like is formed on the surface of a semiconductor substrate, P type or N type impurities need be diffused in the semiconductor substrate. Ion implantation is employed as one method of diffusing the impurities into the semiconductor substrate. As described in an article entitled "ION IMPLANTATION" by T. E. SEIDEL in VLSI TECHNOLOGY, chapter SIX, pp. 219-265, edited by SZE, the ion implantation method is a method of ionizing such as gas including impurities, selectively taking out the required ions of the ionized gas by mass spectrometry employing an electric field/magnetic field, accelerating the ions by the electric field to irradiate the semiconductor substrate, thereby implanting the impurities into the semiconductor substrate. This method is an indispensable technology for an LSI (Large Scale Integrated Circuit) with increased high performance due to high accuracy in the control of the amount of impurities and of the thickness of impurity layers to be formed. As one of the ion implantation methods for the LSI, a method in which photoresist is used as a mask in implantation is known.

A method of manufacturing a conventional semiconductor device, to which such method as described above is applied will be described with reference to FIGS. 8A-8E.

Referring to FIGS. 8A and 8B, an insulating film 2 is formed on a silicon substrate or a semiconductor substrate 1. Next, referring to FIG. 8C, a resist film 3 is formed on the insulating film 2, and by employing photolithography and etching, the insulating film 2 and the resist film 3 which are positioned in a region to be an active region are removed to form an opening portion 4. Referring to FIG. 8D, ions such as boron or phosphorus are implanted in the semiconductor substrate 1 through the opening portion 4. Accordingly, an active region 6 is formed in the semiconductor substrate 1. At this time, ions 5 also enter the resist film 3. Since the resist film 3 is electrically insulated by the insulating film 2 from the semiconductor substrate 1, a charge 7 becomes stored in the resist film 3 as ion implantation proceeds, as shown in FIG. 8E.

The above described process of ion implantation is carried out in a high vacuum chamber. Since this vacuum chamber is grounded, the semiconductor substrate 1 is at the ground level. Further, there exist in the chamber ion species incident on and directed onto the semiconductor substrate to be a target. Consequently, the charge stored into the resist film 3 is transferred to the semiconductor substrate or chamber with the ion species, and is then spontaneously discharged out of the chamber. Since a decrease in the charge due to the above described spontaneous discharge is, however, extremely slow, a large portion of ions implanted in the resist film 3 remains therein. Therefore, the ions or charges increase as the time of implantation increases.

To increase productivity recently, as the current value of ions increases from a conventional value of 500 $\mu A/cm^2$ through 1 $mA/cm^2$ to several $mA/cm^2$ through 10 $mA/cm^2$, the charge stored in the resist film 3 increases considerably. Further, since the semiconductor substrate 1 is normally at the ground level, a potential difference between the resist film 3 and the semiconductor substrate 1 sharply increases. As described above, as the potential rises, discharge occurs in the end portion 300 of the resist film, with the end portion of the film 2 having the lowest breakdown voltage, sandwiched between the resist film and the substrate. At this time, the charge stored in the resist film 3 rapidly flows into the semiconductor substrate 1 through this discharge portion, so that the semiconductor substrate positioned beneath the end portion 300 of the resist film, particularly the active region 6 is destroyed. In fact, when the resist film 3 has a potential of several hundred volt for the semiconductor substrate 1 by charging, a high electric field occurs between the resist film 3 and the semiconductor substrate 1, so that a hole is made in the insulating film 2 sandwiched therebetween due to discharging. This phenomenon is called dielectric breakdown. As a degree of integration of the semiconductor device becomes increased, the insulating film 2 becomes progressively thinner, so that the dielectric breakdown is liable to occur.

To avoid the dielectric breakdown, time-consuming ion implantation has been carried out with an ion implantation current corresponding to a very little discharge current, resulting in a decrease in productivity.

Referring to FIG. 9, Japanese Patent Laying-Open No. 63-58824 discloses a process for ion implantation comprising the steps of forming a photoresist film 3a in a region of a semiconductor substrate 1 to be masked, forming a conductive thin film 3b made of charge transfer-type organic conducting materials in the entire surface of the semiconductor substrate 1, and implanting ions on the conductive thin film 3b into the semiconductor substrate 1 so as to form an ion implantation region 6a.

Japanese Patent Laying-Open No. 58-96732 discloses another process for ion implantation comprising the steps of forming a photoresist film on a prescribed region of the semiconductor substrate, forming an Al film on the photoresist film, the portion of which is electrically connected to the semiconductor substrate, and implanting ions with the Al film and the photoresist film used as masks.

Japanese Patent Laying-Open No. 60-116128 discloses that a conductive film is formed on the entire surface of the semiconductor substrate before ion implantation.

According to these disclosures, applying the charge stored in the photoresist film to the grounded semiconductor substrate through the conductive film prevents the photoresist film used as a mask from being charged. However, a processing step of forming the conductive film is required, so that there is a problem that the number of the processing steps increases.

As has been described, there exists a problem in a conventional method of manufacturing the semiconductor device that in order to prevent the resist film used as a mask from being charged, the time-consuming ion implantation and the processing step of forming the conductive film are required.

SUMMARY OF THE INVENTION

It is an object of the present invention to carry out ion implantation in a semiconductor device without addition of a particular conductive film.

It is another object of the present invention to carry out ion implantation in the semiconductor device in a short period of time.

It is a further object of the present invention to provide a method of manufacturing a highly productive semiconductor device which can carry out ion implantation in a short period of time without addition of a conductive film.

According to the present invention, the above mentioned and other objects are attained by providing a semiconductor substrate having a surface, an insulating film formed on the surface of the semiconductor substrate leaving a portion thereof, and a conductive resist film covering a region of the semiconductor substrate to be masked in ion implantation, extending a surface region of the semiconductor substrate where the insulating film is not formed, and electrically connected directly to the semiconductor substrate on its surface.

According to another aspect of the present invention, the semiconductor device includes a predetermined conductivity type semiconductor substrate having a major surface, a semiconductor region having the opposite conductivity type to the conductivity type of the semiconductor substrate, formed on a predetermined region of the major surface of the semiconductor substrate, an impurity region with the same conductivity type as that of the semiconductor substrate, formed on the major surface of the semiconductor substrate other than the semiconductor region, a conductive resist film covering the semiconductor region, extending over the impurity region, and electrically connected directly to the semiconductor substrate in the impurity region.

According to the present invention, a method of manufacturing the semiconductor device includes the steps of forming an insulating film on the surface of the semiconductor substrate, exposing a portion of the semiconductor substrate by removing a predetermined portion of the insulating film, forming a resist film by coating a region of the semiconductor substrate to be masked and an exposed region thereof with the conductive resist film, and implanting ions in the semiconductor substrate with the resist film used as a mask.

According to another aspect of the present invention, a method of manufacturing the semiconductor device includes the steps of forming an insulating film on a predetermined region of the semiconductor substrate of a predetermined conductivity type having a major surface, forming a semiconductor region of the opposite conductivity type to the conductivity type of the semiconductor substrate on the major surface of the semiconductor substrate by implanting ions in the semiconductor substrate with the insulating film used as a mask, removing the insulating film, forming an impurity region of the same conductivity type as that of the semiconductor substrate on the major surface of the semiconductor substrate other than the semiconductor region, forming a resist film by coating the semiconductor region and impurity region with a conductive resist film, and implanting ions in the semiconductor substrate with the resist film used as a mask.

According to still another aspect of the present invention, a method of manufacturing the semiconductor device includes the steps of forming in a predetermined region of a semiconductor substrate including a first semiconductor region of a first conductivity type, a second semiconductor region of the opposite conductivity type to the first conductivity type; forming a first gate insulating film and a first gate electrode on the major surface of the first semiconductor region and forming a second gate insulating film and a second gate electrode on the major surface of the second semiconductor region; coating portions other than a portion of the major surface on the first semiconductor region with a conductive resist to form a first conductive resist film; forming a low electrical resistance region of the same conductivity type as that of the first semiconductor region on the uncoated portion of the first semiconductor region by implanting ions into the semiconductor substrate, with the first conductive resist film and the second gate electrode in the second semiconductor region used as masks, and forming source/drain regions of the opposite conductivity type to that of the second semiconductor region in the second semiconductor regions, discharging a charge stored in the first conductive resist film, during ion implantation, to the semiconductor substrate through the first semiconductor regions except the first gate electrode forming regions; removing the first conductive resist film; coating the low electric resistance region of the first semiconductor region and the second semiconductor region with a conductive resist to form a second conductive resist film; forming source/drain regions of the opposite conductivity type to that of the first semiconductor region, in regions other than the low electric resistance region by implanting ions into the semiconductor substrate, with the second conductive resist film and the first gate electrode of the first semiconductor region used as masks; discharging a charge stored in the second conductive resist film, during ion implantation, to the semiconductor substrate through the low electrical resistance region; and removing the second conductive resist film.

According to the present invention, since the charge stored in the conductive resist film used as a mask in ion implantation flows into the semiconductor substrate through an interface of the semiconductor substrate and the conductive resist film and dissipates in the semiconductor substrate of the ground level, the resist film is not charged, so that the active region is not destroyed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

(I) The First Embodiment

Figure 1A:
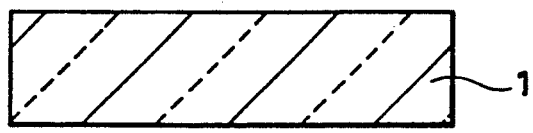
FIGS. 1A-1E are cross sectional views of a semiconductor device of a first embodiment of the present invention, which show various processing steps of a manufacturing method thereof.
Figure 1B:
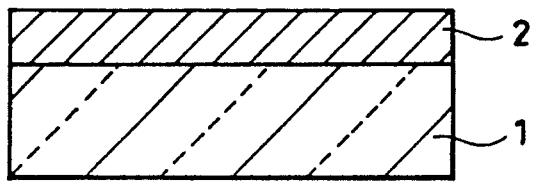
Figure 1C:
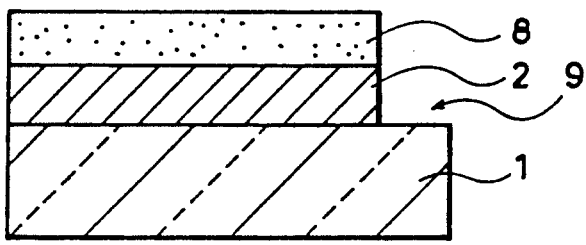

Referring to FIGS. 1A and 1B, an insulating film 2 is formed on a silicon substrate or a semiconductor substrate 1. Referring to FIG. 1C, a conductive resist film 8 is formed by applying a conductive resist onto the insulating film 2. Those used for the conductive resist are organic matters which do not include metals causing the problem of leakage current in the LSI during a subsequent thermal process and have superior conductivity. One example thereof is a TTF-TCNQ complex disclosed in U.S. Ser. No. 106,253 filed on Oct. 9, 1987 by Miura et al. and assigned to Mitsubishi Chemical Industries Ltd. and Mitsubishi Denki Kabushiki Kaisha. The TTF-TCNQ complex is the combination of tetrathiafulvalene (hereinafter abbreviated to TTF) as a donor, and tetracyanoquinodimethane (hereinafter abbreviated to TCNQ) as an acceptor. Next, by employing photolithography and etching, the respective portions of the insulating film 2 and conductive resist film 8 are removed to expose a portion of the region 9 of the semiconductor substrate 1.

Figure 1D:
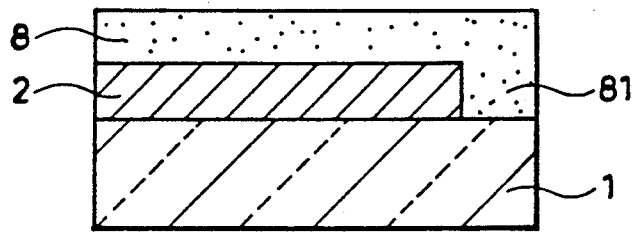
Figure 1E:
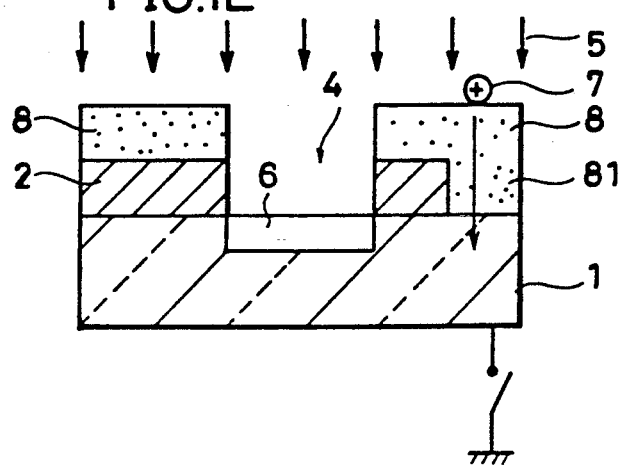

Referring to FIG. 1D, the conductive resist is again applied. Accordingly, a contact portion 81 is formed to be electrically connected to the semiconductor substrate 1. Referring to FIG. 1E, by employing photolithography and etching, the insulating film 2 and the conductive resist film 8 positioned in a region to be an active region are removed to form an opening portion 4. Ions 5 such as boron, phosphorus etc. are implanted in the semiconductor substrate 1 through the opening portion 4. Accordingly, an active region 6 is formed in the semiconductor substrate 1. A charge 7 of ions entering the conductive resist film 8 flows out to the semiconductor substrate 1 through the contact portion 81. The charge 7 can be dissipated by bringing the semiconductor substrate 1 to the ground level as shown in FIG. 1E. Therefore, the conductive resist film 8 is not charged, so that no obstacle occurs in the active region. The conductive resist film 8 is removed thereafter.

(II) The Second Embodiment

Figure 2:
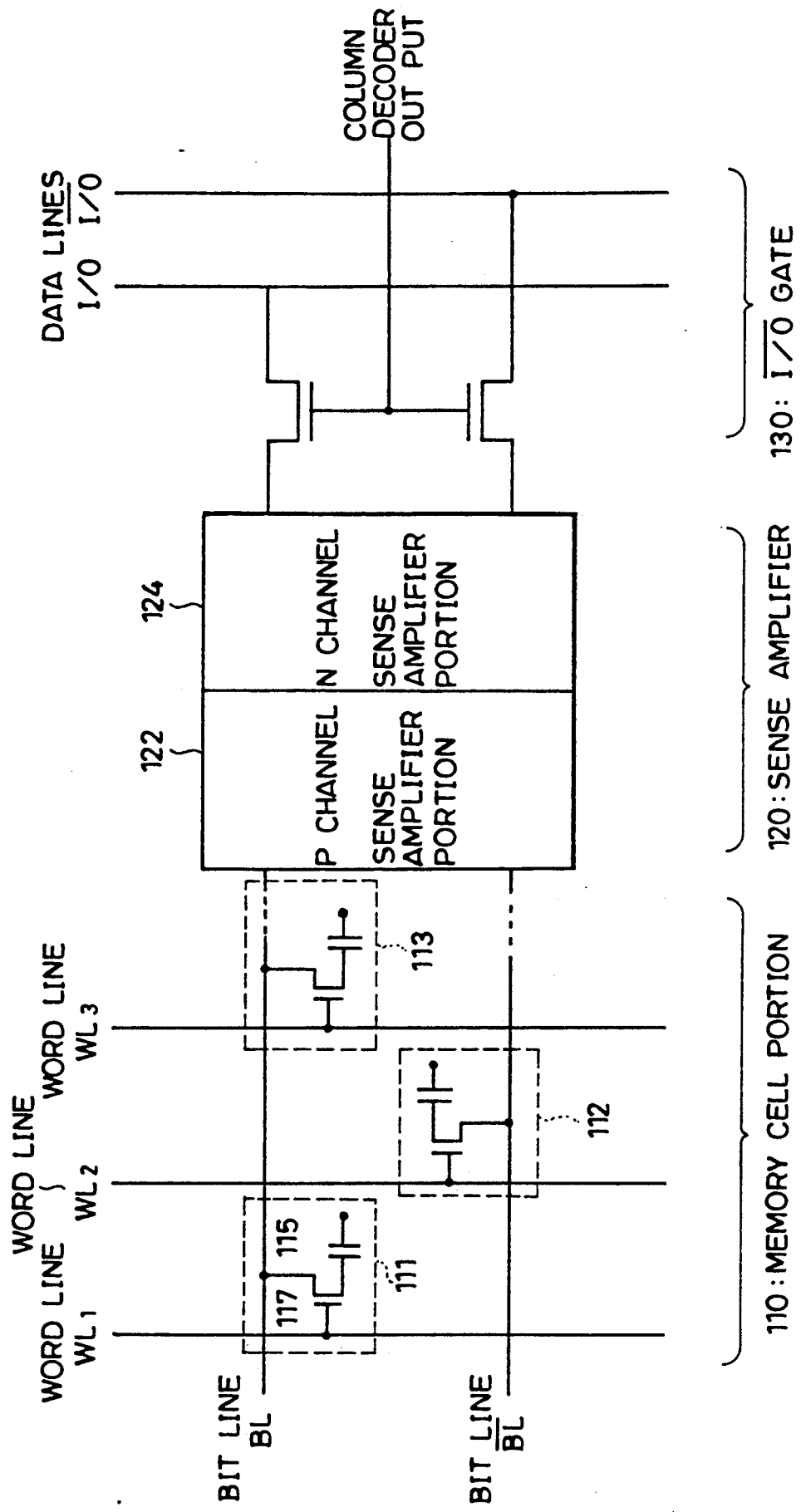
FIG. 2 is a diagram showing the entire configuration of a dynamic random access memory according to a second embodiment of the present invention.

As shown in FIG. 2, word lines and a bit line pair intersecting the word lines are provided in a memory cell portion 110. FIG. 2 shows three of the word lines for simplification. Memory cells 111-113 are provided at the intersections of the word lines WL1-WL3 and the bit line pair BL, $\overline{BL}$, respectively. Each of the memory cells comprises a capacitor 115 for storing a signal charge as stored information, and a MOS type FET 117 functioning as a switching element for connecting or cutting off the capacitor 115 and the bit line BL or $\overline{BL}$. The bit line pair BL, $\overline{BL}$ is connected to a sense amplifier 120. The sense amplifier 120 detects outputs from the memory cells and amplifies them in reading of the signal charge. The sense amplifier 120 is formed of a P channel sense amplifier portion 122 and an N channel sense amplifier portion 124. The sense amplifier 120 is connected to an I/O gate 130. The I/O gate 130 derives data from the memory cell portion 110 and writes the data into the memory cell portion 11. The data is inputted/outputted through the data lines I/O, I/O.

Figure 3:
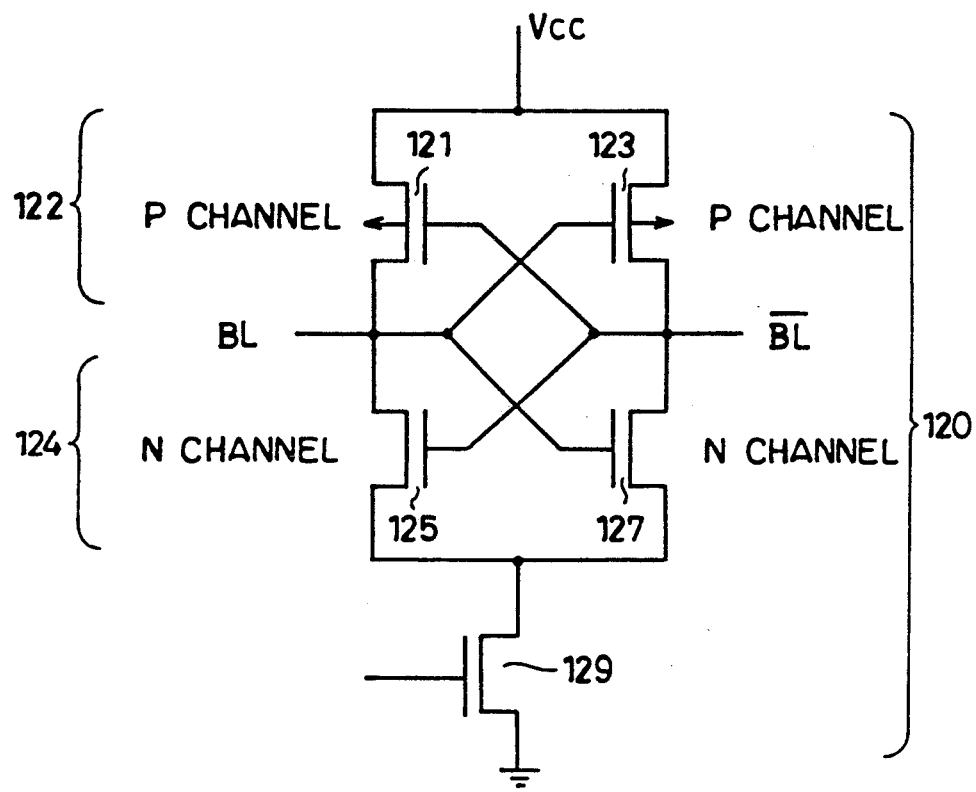
FIG. 3 is a diagram showing an equivalent circuit of a sense amplifier shown in FIG. 2.

As shown in FIG. 3, the sense amplifier 120 includes P channel MOS transistors 121 and 123 of P type channel, and N channel MOS transistors 125 and 127 of N type channel. The bit line BL is connected to the respective gates of the P channel MOS transistor 123 and the N channel MOS transistor 127 and to one source/drain of each of the P channel MOS transistor 121 and the N channel MOS transistor 125, while the bit line $\overline{BL}$ is connected to the respective gates of the P channel MOS transistor 121 and the N channel MOS transistor 125 and to one source/drain of each of the P channel MOS transistor 123 and the N channel MOS transistor 127. The P channel MOS transistors 121 and 123 each have the other source/drain connected to a line of supplying voltage $V_{cc}$. The other source/drain of each of the N channel MOS transistors 125 and 127 is connected to a transistor 129 for activating the sense amplifier 120.

Figure 4:
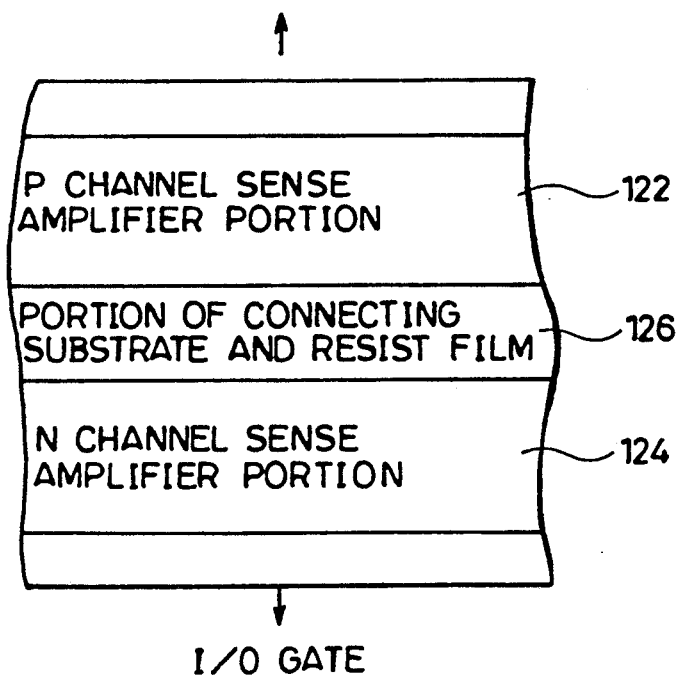
FIG. 4 is a top view, which shows a pattern layout of the sense amplifier shown in FIG. 2.

As shown in FIG. 4 which is a top view of the sense amplifier, a portion 126 connecting the substrate and the resist film is provided between the P channel sense amplifier portion 122 and N channel sense amplifier portion 124.

Figure 5A:
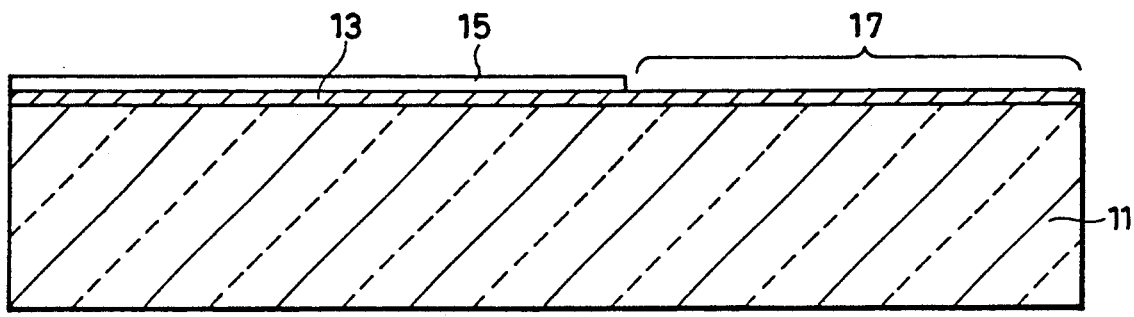
FIGS. 5A-5N are cross sectional views of the sense amplifier in the second embodiment of the present invention, which show various processing steps of a manufacturing method thereof.

FIGS. 5A-5N are cross sectional views of the sense amplifier shown in FIGS. 2, 3 and 4, which show various processing steps of a manufacturing method thereof. Next, a method of manufacturing the sense amplifier will be described with reference to FIGS. 5A-5N.

Figure 5B:
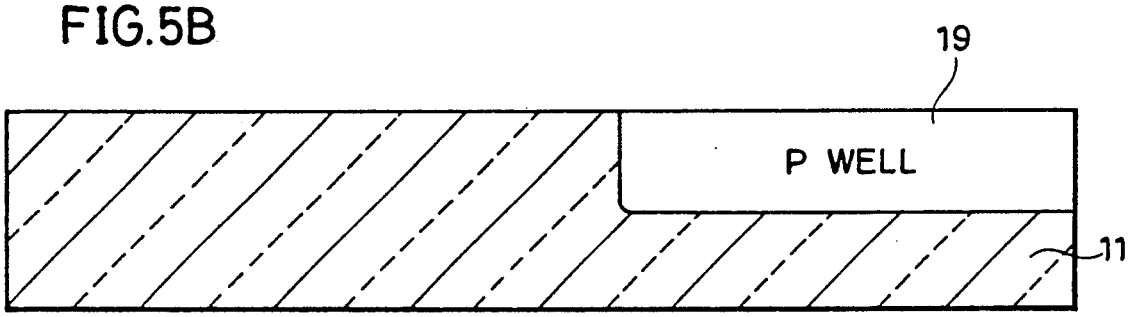

Referring to FIG. 5A, a silicon oxide film 13 is formed on an N type silicon substrate 11 by a thermal oxidation method, and a silicon nitride film 15 is then formed on the silicon oxide film 13 by employing the CVD method. A region 17 of the silicon nitride film 15 where a P type well is to be formed is then removed by dry etching, and P type impurities are implanted by the ion implantation method. The silicon nitride film 15 and silicon oxide film 13 are then removed by etching, and further thermal processing is carried out. Accordingly, a P type well (hereinafter referred to as a P well) 19 is formed as shown in FIG. 5B.

Figure 5C:
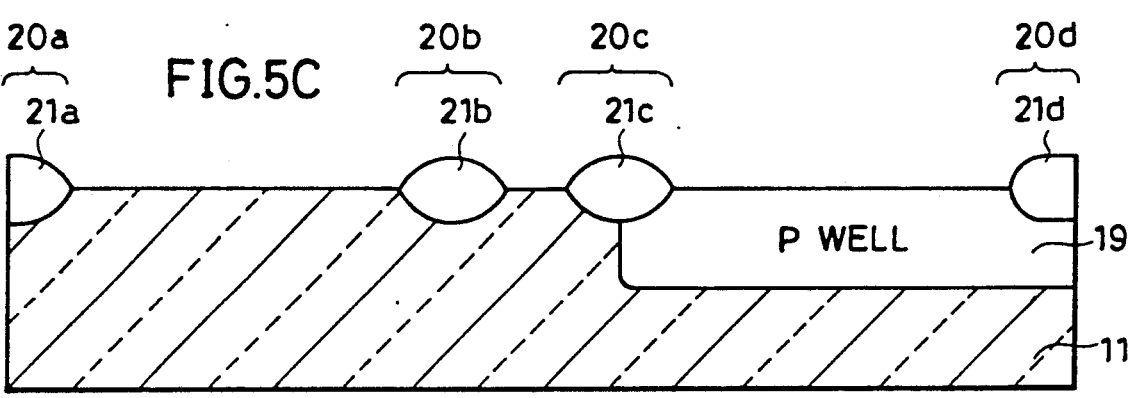

Referring to FIG. 5C, similarly to FIG. 5A, a thin silicon oxide film is formed on the entire surface of the semiconductor substrate 11 by the thermal oxidation method, and a silicon nitride film is then formed on this silicon oxide film by employing the CVD method. Regions 20a-20d of the silicon nitride film to be isolation regions are removed by dry etching, and a thick silicon oxide film is then formed in the regions 20a-20d to be the isolation regions by employing the thermal oxidation method. Next, the silicon nitride film and the thin silicon oxide film are removed by etching to expose the surface of the N type silicon substrate 11 other than the isolation regions. Accordingly, silicon oxide films 21a-21d are obtained.

Figure 5D:
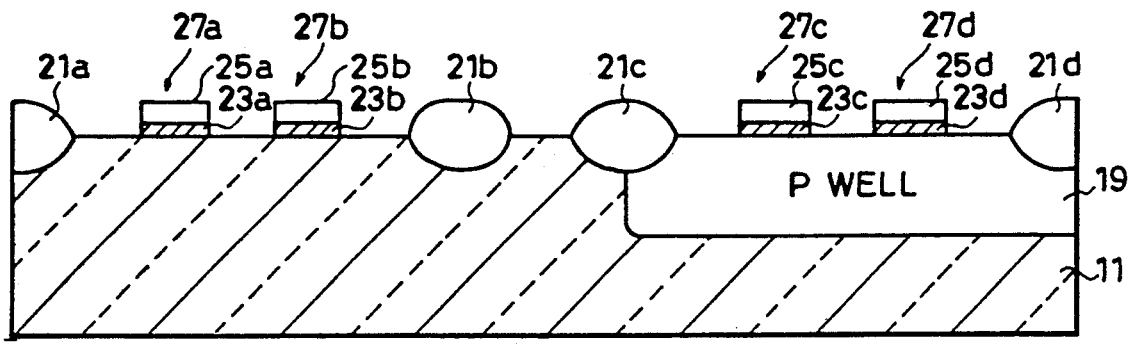

Referring to FIG. 5D, the exposed surface of the N type silicon substrate 11 is thermally oxidized to form an oxide film, and a polycrystalline silicon film is then formed on the oxide film by employing the CVD method. Next, the oxide film and polycrystalline silicon film except a region to be a gate are removed by dry etching to be processed to a pattern of a gate electrode. Accordingly, there are formed a first gate portion 27a formed of a gate insulating film 23a and a gate electrode 25a, a second gate portion 27b formed of a gate insulating film 23b and a gate electrode 25b, a third gate portion 27c formed of a gate insulating film 23c and a gate electrode 25c, and a fourth gate portion 27d formed of a gate insulating film 23d and a gate electrode 25d. The first and second gate portions 27a and 27b are provided to contact the N type silicon substrate 11, and the third and fourth gate portions 27c and 27d are provided to contact the P well.

Figure 5E:
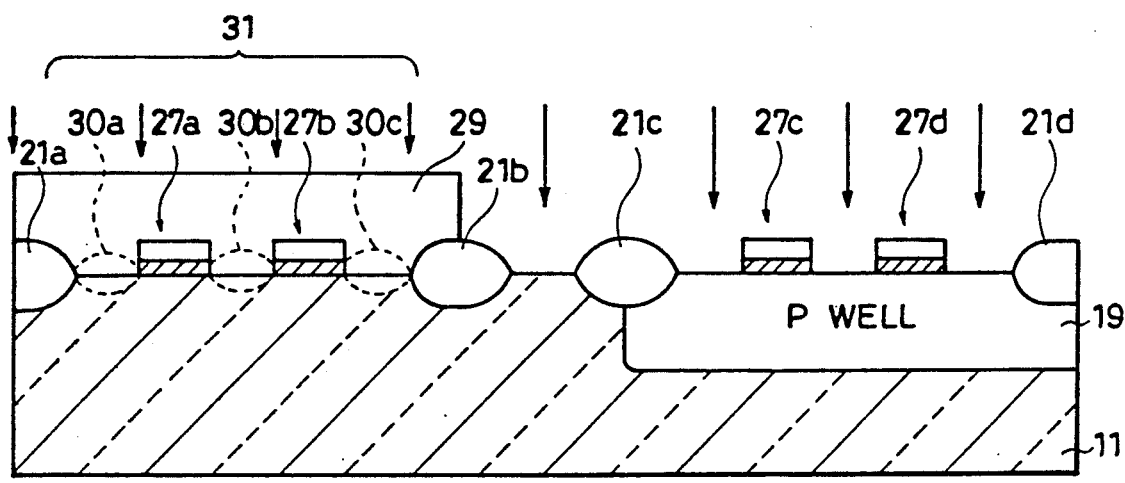
Figure 5F:
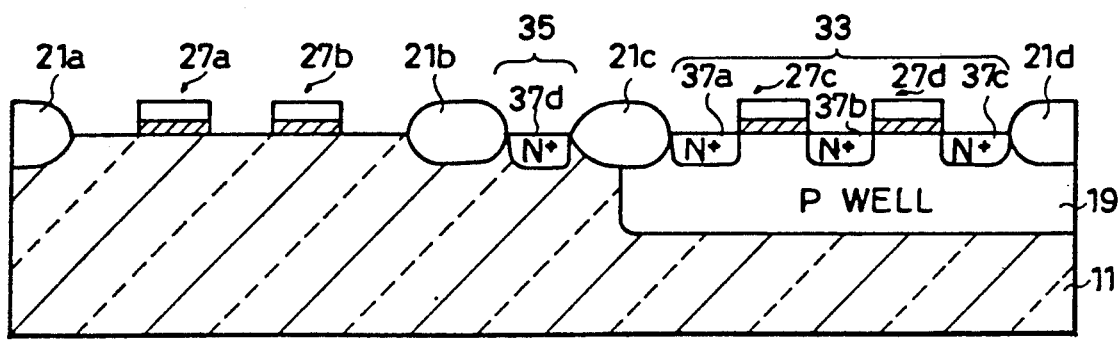

Referring to FIG. 5E, a conductive resist film 29 is formed on a region 31 of the N type silicon substrate 11 where a P channel MOS transistor is to be formed (hereinafter referred to as a P channel MOS forming region) by employing the same conductive resist as in the first embodiment. Next, by using the conductive resist film 29, the silicon oxide films 21b, 21c and 21d, and the third and fourth gate portions 27c and 27d as masks, N type impurities are ion-implanted into the entire surface of the N type silicon substrate 11, and thermal processing is carried out. Accordingly, N+ regions 37a-37c are formed in a region 33 where an N channel MOS transistor is to be formed (hereinafter referred to as an N channel MOS forming region), and an N$^{30}$ region 37d is formed in a region 35 to be a portion connecting the substrate and the conductive resist film, as shown in FIG. 5F. In ion implantation shown in FIG. 5E, the charge of ions which enter the conductive resist film 29 flows into the N type silicon substrate 11 through connecting regions 30a-30c between the N type silicon substrate 11 and the conductive resist film 29. The charge which flowed into the silicon substrate 11 is dissipated by grounding of the N type silicon substrate 11. Therefore, the conductive resist film 29 is not charged even in ion implantation. Although ions are implanted also into gate portions 27c and 27d, the area of the gates is extremely smaller than that of the conductive resist film, so that such a charge is not stored in the gate portions 27c and 27d as to cause the dielectric breakdown.

Figure 5G:
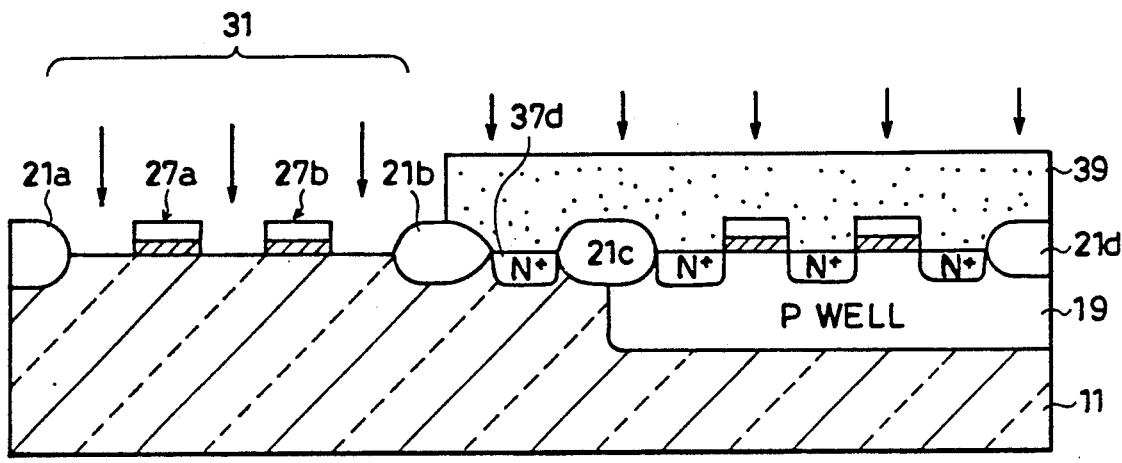
Figure 5H:
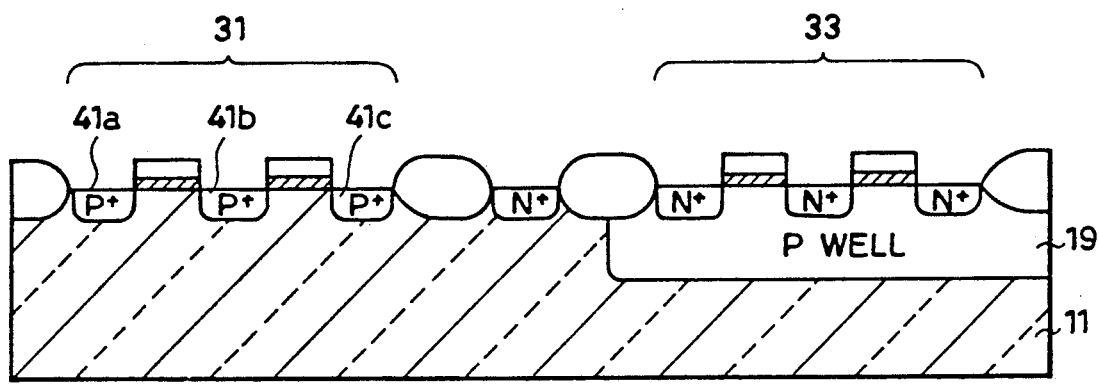

Referring to FIG. 5G, a conductive resist film 39 is formed in regions other than the P channel MOS forming region 31. P type impurities are ion-implanted in the N type silicon substrate 11 by using the silicon oxide films 21a and 21b, the first and second gate portions 27a and 27b, and the conductive resist film 39 as masks. The charge of ions which enter the conductive resist film 39 in ion implantation, flows in the N type silicon substrate 11 through the N+ region 37d contacting the N type silicon substrate 11. The injected charge is dissipated by grounding of the silicon substrate 11, as described above. Therefore, the conductive resist film 39 is nöt charged either in this case. As has been described, P+ regions 41a-41c shown in FIG. 5H are formed in the region 31 of the N type silicon substrate 11.

Ion implantation is then again carried out in the P channel MOS forming region 31 and the N channel MOS forming region 33, respectively. The steps of this ion implantation will now be described.

Figure 5I:
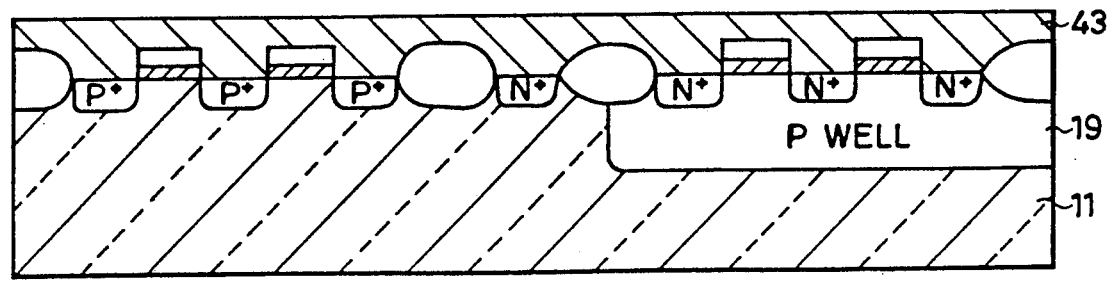
Figure 5J:
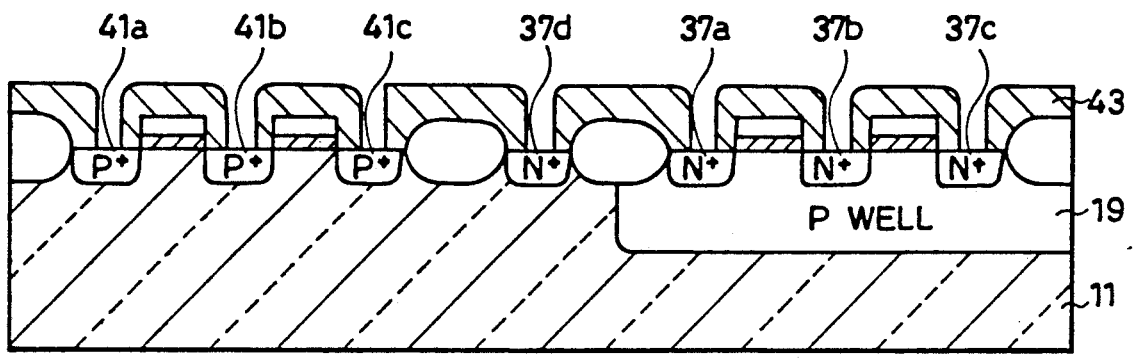
Figure 5K:
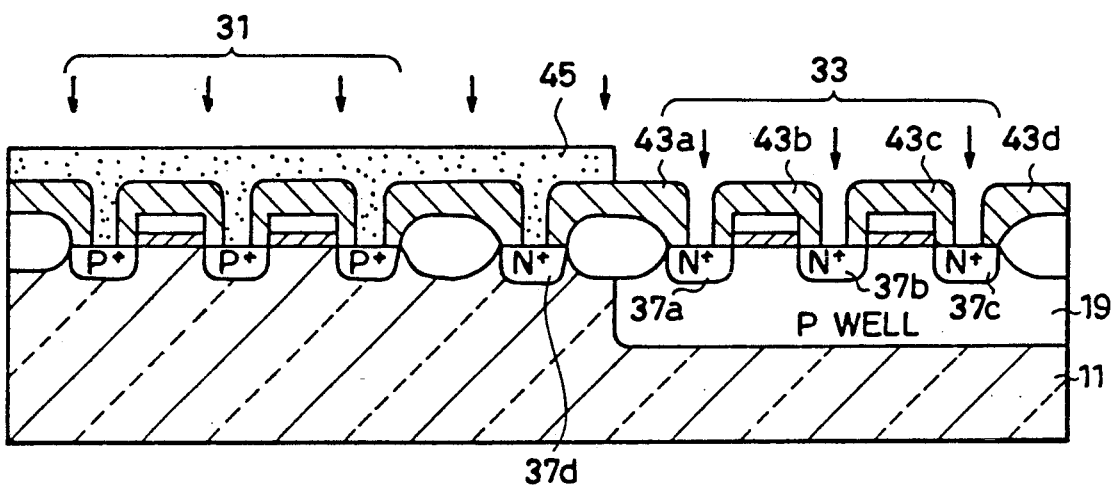
Figure 5L:
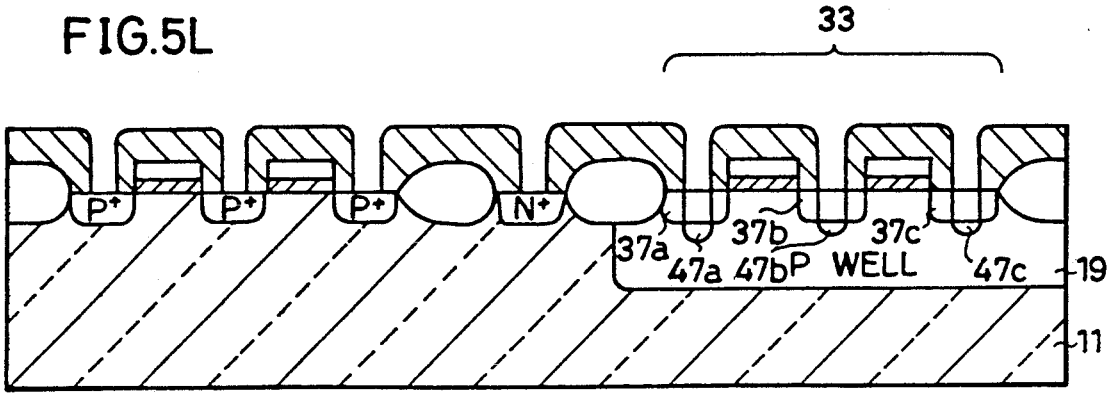

Referring to FIG. 5I, a silicon oxide film 43 is formed on the entire surface of the N type silicon substrate 11 by the CVD method. Next, referring to FIG. 5J, a prescribed region of the silicon oxide film 43 is etched away to expose the respective portions of the P+ regions 41a-41c and of the N+ regions 37a-37d. Referring to FIG. 5K, the same conductive resist film 45 as in the above description is formed on regions other than the N channel MOS forming region 33. The N type impurities are then again ion-implanted in the N+ regions 37a-37c of the P well 19, with the conductive resist film 45, and the silicon oxide films 43a-43d of the N channel MOS forming region 33 used as masks. The charge of ions entering the conductive resist film 45, in ion implantation, flows in the N type silicon substrate 11 through the N+ region 37d provided between the P channel MOS forming region 31 and N channel MOS forming region 33. The charge flowing in the silicon substrate 11 is dissipated by grounding of the N type silicon substrate 11. As a result, the conductive resist film 45 is not charged either in this case. By this ion implantation, N+ regions 47a-47c are formed in the N channel MOS forming region 33 in a self-aligning manner, as shown in FIG. 5L.

Referring to FIG. 5M, the same conductive resist film 49 as in the above description is formed on regions other than the P channel MOS forming region 31. The P type impurities are then again ion-implanted in the P+ regions 41a-41c of the N type silicon substrate 11 by using the conductive resist film 49, the silicon oxide films 43e-43h of the P channel MOS forming region 31 as masks. In this ion implantation, the charge of ions entering the conductive resist film 49 flows into the N type silicon substrate 11 through the N+ region 37d provided between the P channel MOS forming region 31 and N channel MOS forming region 33 as in the case of FIG. 5K. The charge which flowed in the silicon substrate 11 is dissipated by grounding of the N type silicon substrate 11. Therefore, the conductive resist film 49 is not charged either in this case. P+ regions 51a-51c are formed in the P channel MOS forming region 31 in a self-aligning manner through this ion implantation, as shown in FIG. 5N. As mentioned heretofore, a sense amplifier is formed including two P channel MOS transistors 121 and 123 and two N channel MOS transistors 125 and 127.

Briefly, in the above described second embodiment, portions connecting the substrate and the conductive resist film are provided between the P channel MOS transistors and N channel MOS transistors, and in implantation of ions into the P channel MOS forming region, the N channel MOS forming region and the above described connecting portions are coated with the conductive resist film, and the charge of ions entering the conductive resist film in ion implantation leaks into the substrate through the connecting portions; on the other hand, in implantation of ions into the N channel MOS forming region, the P channel MOS forming region and the above connecting portions are coated with the conductive resist film, and the charge of ions entering the conductive resist film in ion implantation leaks into the substrate through the connecting portions. Therefore, the above connecting portions are very useful since they serve to conduct the charge when ions are implanted both into the N channel MOS forming region and into the P channel MOS forming region.

In the above described embodiment, a region which is a portion of the surface region of the semiconductor substrate and on which impurities of the same conductivity type as that of the semiconductor substrate are diffused, is used as the portion connecting the substrate and the conductive resist film; however, the surface region of the semiconductor substrate where impurities are not implanted as in the first embodiment may be used.

Although the embodiment of the invention applied to the N type silicon substrate has been described in the foregoing, the same may be applied to the P type silicon substrate. In such a case, the $P^{30}$ region or the surface region of the semiconductor substrate is employed as the connecting portion.

The portions connecting the substrate and the resist film are provided in the mid portions of the semiconductor devices in the above described embodiment; however, the same may be provided anywhere without being limited to the mid portions of the devices. Next, another structure of the connecting portions will be described.

Figure 6A:
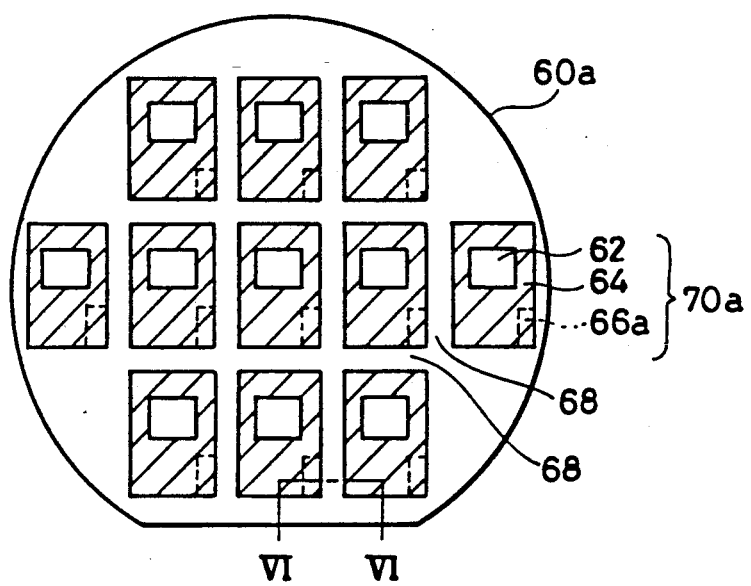
FIG. 6A is a diagram showing a structure of portions connecting a substrate and a resist film of the present invention.
Figure 6B:
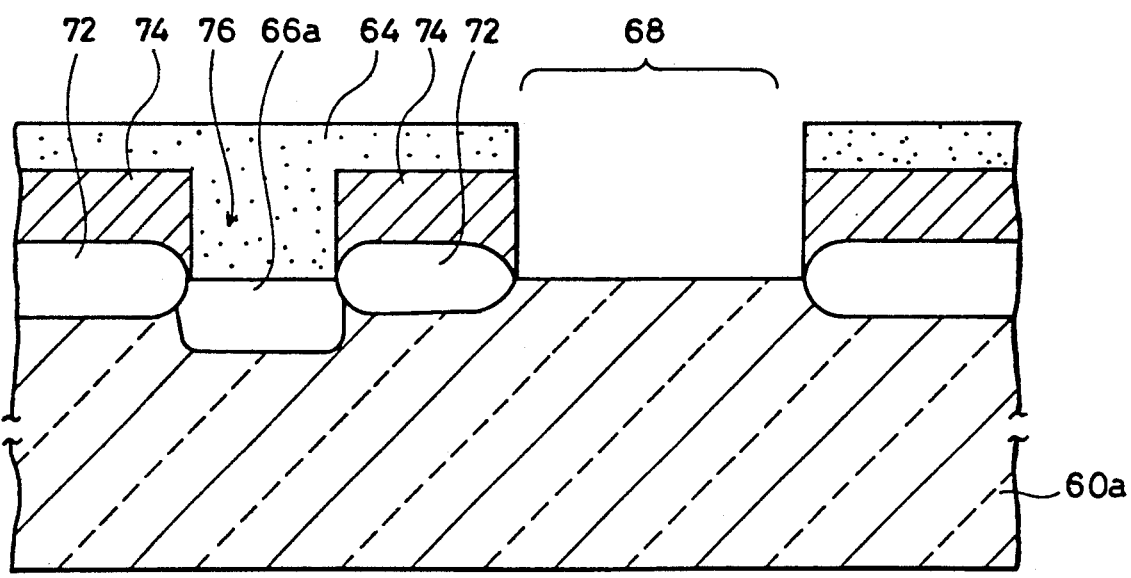
FIG. 6B is a cross sectional view taken along the line VI—VI shown in FIG. 6A.

As shown in FIG. 6A, semiconductor devices 70a are provided in a matrix in a wafer or a semiconductor substrate 60a. Each of the semiconductor devices 70a is spaced apart from its adjacent semiconductor device by a dicing line 68. An active region 62 is formed in each of the semiconductor devices 70a. A conductive resist film 64 is formed to surround the active region 62. A portion 66a connecting the conductive resist film 64 and the substrate 60a is provided in the end portion of each of the semiconductor devices 70a. As shown in FIG. 6B, the connecting portion 66a is in more detail formed as an impurity diffusion region, in the surface of the substrate 60a in an opening region 76 formed on an oxide film 72 for isolation and an insulating film 74. The conductivity type of the connecting portion 66a is the same as that of the substrate 60a.

The connecting portion 66a serves to allow the charge of ions entering the conductive resist film 64 to leak into the substrate 60a when ion implantation in the active region 62 is carried out with the conductive resist film 64 used as a mask.

Figure 7A:
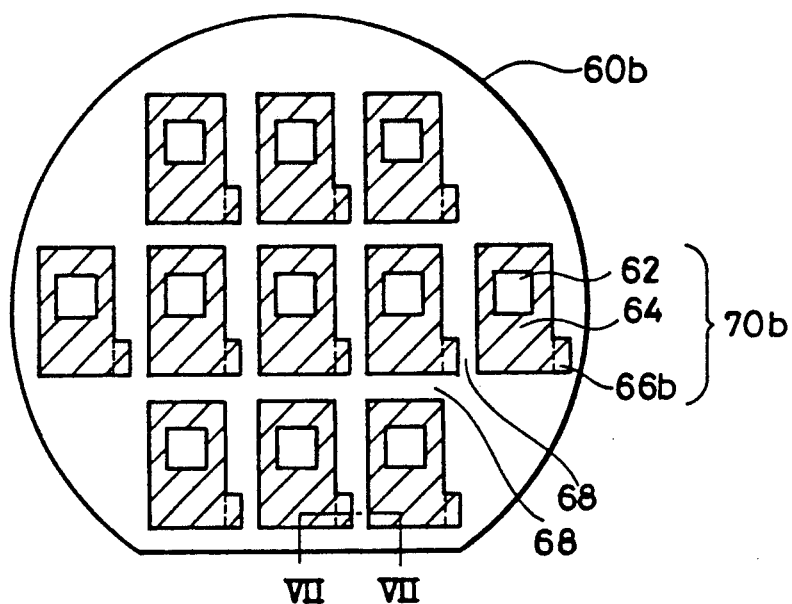
FIG. 7A is a diagram showing a variation of the structure of portions connecting the substrate and the resist film of the present invention.
Figure 7B:
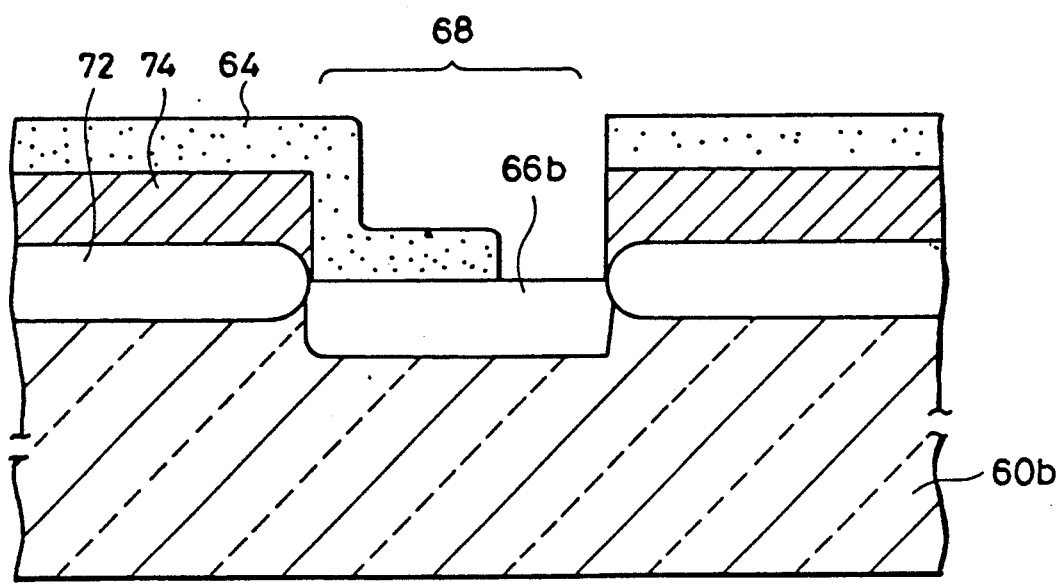
FIG. 7B is a cross sectional view taken along the line VII—VII shown in FIG. 7A.
Figure 8A:
FIGS. 8A-8E are cross sectional views of a conventional semiconductor device, which show various processing steps of a manufacturing method thereof.
Figure 8B:
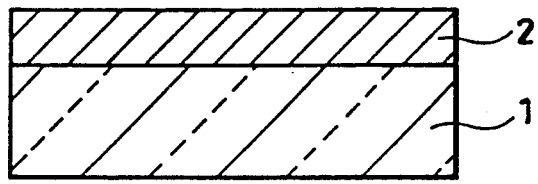
Figure 8C:
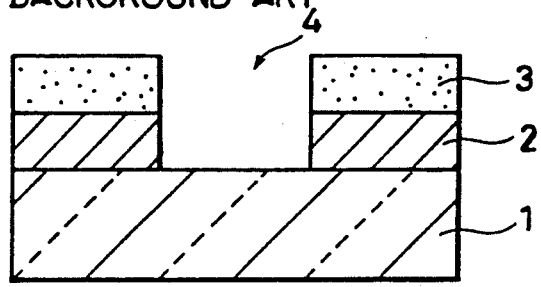
Figure 8D:
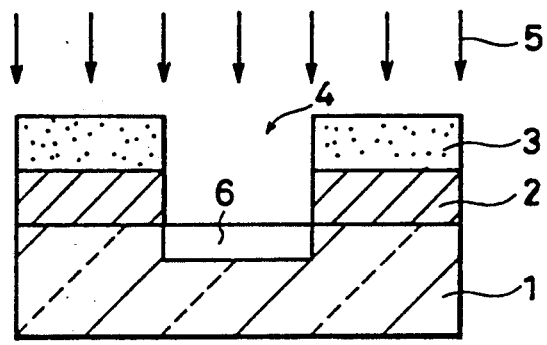
Figure 8E:
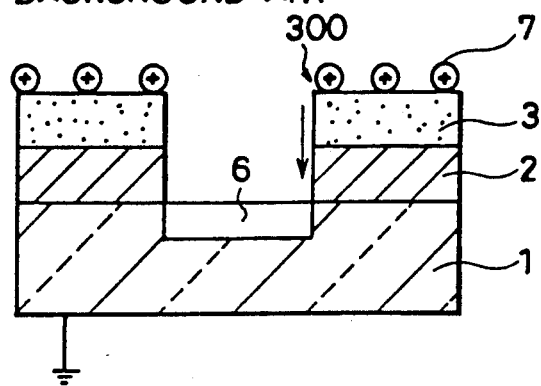
Figure 9:
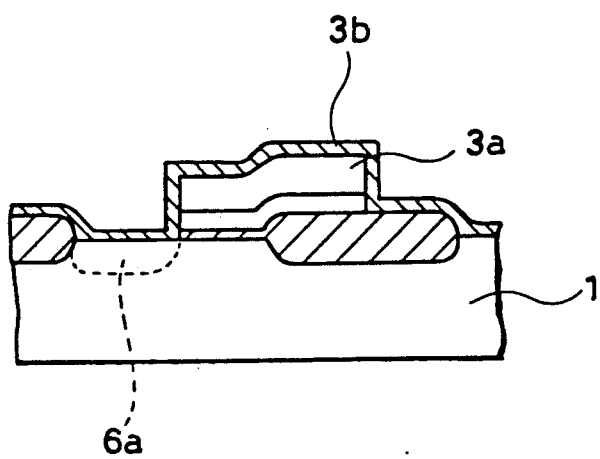
FIG. 9 is a view showing a process for ion implantation in the conventional semiconductor device.

Referring to FIGS. 7A and 7B, the connecting portion 66b of the resist film and the substrate is provided within the dicing line or a dicing region 68. The conductive resist film 64 extends to the connecting portion 66b in the dicing line 68. As mentioned heretofore, by providing in the dicing line the above described connecting portion which does not function as the active region or is not required for the semiconductor device as a product, the area occupied by the semiconductor devices can be reduced, and the number of chips obtained from one substrate can be increased.

As has been described in the foregoing, according to the present invention, since the conductive resist film is electrically connected to the semiconductor substrate, a highly mass-productive and reliable semiconductor device can be provided.

Although the present invention has been described and illustrated in detail, it is clearly understood that the same is by way of illustration and example only and is not to be taken by way of limitation, the spirit and scope of the present invention being limited only by the terms of the appended claims. For example, no conductive resist film is provided in the gate electrode used as a mask in the above described embodiments; however, the conductive resist film may be provided in this gate electrode in order to prevent charge-up.

What is claimed is:

1. A method of manufacturing a semiconductor device, comprising the steps of:
   forming an insulating film on a surface of a semiconductor substrate,
   exposing a portion of said semiconductor substrate by removing a predetermined portion of said insulating film
   forming a conductive resist film by coating a region of said semiconductor substrate to be masked and said exposed portion of said semiconductor substrate with a conductive resist, and
   implanting ions into said semiconductor substrate by employing said conductive resist film as a mask.

2. A method of manufacturing a semiconductor device in accordance with claim 1, further comprising the step of discharging a charge stored in said conductive resist film during said ion implantation to said semiconductor substrate through a portion of said conductive resist film coating said exposed portion of said semiconductor substrate.

3. A method of manufacturing a semiconductor device in accordance with claim 2, further comprising the step of removing said conductive resist film.

4. A method of manufacturing a semiconductor device in accordance with claim 1, wherein said conductive resist film comprises a combination of tetrathiafulvalene and tetracyanoquinodimethane.

5. A method of manufacturing a semiconductor device, comprising the steps of:
   forming an insulating film on a predetermined region of a semiconductor substrate of a predetermined conductivity type having a major surface,
   forming a semiconductor region of an opposite conductivity type to the conductivity type of said semiconductor substrate on said major surface of said semiconductor substrate by implanting ions into said semiconductor substrate while utilizing said insulating film as a mask,
   removing said insulating film,
   forming an impurity region of the same conductivity type as that of said semiconductor substrate on a portion of said major surface of said semiconductor substrate other than said semiconductor region,
   forming a conductive resist film by coating said semiconductor region and said impurity region with a conductive resist, and
   implanting ions into said semiconductor substrate by employing said conductive resist film as a mask.

6. A method of manufacturing a semiconductor device in accordance with claim 5, wherein said conductive resist film comprises a combination of tetrathiafulvalene and tetracyanoquinodimethane.

7. A method of manufacturing a semiconductor device in accordance with claim 5, further comprising the steps of:
   discharging a charge stored in said conductive resist film during said ion implantation to said semiconductor substrate through said impurity region, and
   removing said conductive resist film.

8. A method of manufacturing a semiconductor device in accordance with claim 7, further comprising the steps of:
   forming a conductive resist film by coating said impurity region and a portion of said major surface region of said semiconductor substrate other than said semiconductor region with a conductive resist, implanting additional ions into said semiconductor region by employing said conductive resist film as a mask, discharging a charge stored in said conductive resist film during implantation of said additional ions into said semiconductor substrate through said impurity region, and removing said conductive resist film.

9. A method of manufacturing a semiconductor device, comprising the steps of:

forming in a predetermined region of a semiconductor substrate having a major surface and including a first semiconductor region of a first conductivity type, a second semiconductor region of an opposite conductivity type to the first conductivity type, forming a first gate insulating film and a first gate electrode on said major surface of said first semiconductor region and forming a second gate insulating film and a second gate electrode on said major surface of said second semiconductor region, coating portions other than a portion of said major surface of said first semiconductor region with a conductive resist to form a first conductive resist film, forming a low electric resistance region of the same conductivity type as the conductivity type of said first semiconductor region in said uncoated portion of said first semiconductor region by implanting ions into said semiconductor substrate, while utilizing said first conductive resist film and said second gate electrode of said second semiconductor region as masks, and forming source/drain regions of the opposite conductivity type to the conductivity type of said second semiconductor region in said second semiconductor region, discharging a charge stored in said first conductive resist film during implantation of said ions to said semiconductor substrate through said first semiconductor region except said first gate electrode forming region, removing said first conductive resist film, coating said low electric resistance region of said first semiconductor region and said second semiconductor region with a conductive resist to form a second conductive resist film, forming source/drain regions of an opposite conductivity type to the conductivity type of said first semiconductor region by implanting ions into said semiconductor substrate, while utilizing said second conductive resist film and said first gate electrode of said first semiconductor region as masks, discharging a charge stored in said second conductive resist film during implantation of said ions to said semiconductor substrate through said low electric resistance region, and removing said second conductive resist film.

10. A method of manufacturing a semiconductor device in accordance with claim 9, further comprising the steps of:

forming a sidewall insulating film on side portions of said first and second gate electrodes by forming an insulating film on said major surface of said first semiconductor region and on said major surface of said second semiconductor region to cover said first and second gate electrodes and patterning the insulating film, forming a third conductive resist film by coating said first semiconductor region including said low electric resistance region with a conductive resist, forming a region having a conductivity type similar to a conductivity type of said source/drain regions and an impurity concentration higher than an impurity concentration of said source/drain regions formed in said second semiconductor region by implanting ions into said semiconductor substrate, while utilizing said third conductive resist film and said sidewall insulation film of said second semiconductor region as masks, discharging a charge stored in said third conductive resist film during implantation of said ions to said semiconductor substrate through said low electric resistance region, removing said third conductive resist film, coating said low electric resistance region and said second semiconductor region with a conductive resist to form a fourth conductive resist film, forming a region having a conductivity type equal to a conductivity type of said source/drain regions and an impurity concentration higher than an impurity concentration of said source/drain regions formed in said first semiconductor region by implanting ions into said semiconductor substrate, while utilizing said fourth conductive resist film and said sidewall insulation film of said first semiconductor region as masks, discharging a charge stored in said fourth conductive resist film during implantation of said ions to said semiconductor substrate through said low electric resistance region, and removing said fourth conductive resist film.

* * * * *